(12) United States Patent
Palumbo et al.

(10) Patent No.: US 9,006,862 B2
(45) Date of Patent: Apr. 14, 2015

(54) ELECTRONIC SEMICONDUCTOR DEVICE WITH INTEGRATED INDUCTOR, AND MANUFACTURING METHOD

(75) Inventors: Vincenzo Palumbo, Vimercate (IT); Dario Paci, Cornared (IT); Paolo Iuliano, Villa D'adda (IT); Fausto Carace, Monza (IT); Marco Morelli, Bareggio (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 166 days.

(21) Appl. No.: 13/608,880

(22) Filed: Sep. 10, 2012

(65) Prior Publication Data

US 2013/0062730 A1 Mar. 14, 2013

(30) Foreign Application Priority Data

Sep. 9, 2011 (IT) .............................. TO2011A0804

(51) Int. Cl.
*H01L 29/72* (2006.01)
*H01L 23/522* (2006.01)
*H01L 23/64* (2006.01)
*H01L 25/16* (2006.01)

(52) U.S. Cl.
CPC ......... *H01L 23/5227* (2013.01); *H01L 2224/16* (2013.01); *H01L 2224/48091* (2013.01); *H01L 2224/48463* (2013.01); *H01L 23/645* (2013.01); *H01L 25/16* (2013.01); *H01L 2924/30107* (2013.01); *H01L 2924/3011* (2013.01)

(58) Field of Classification Search
CPC ................................................. H01L 23/5227
USPC ........................... 257/531, E21.002, E27.046
See application file for complete search history.

(56) References Cited

U.S. PATENT DOCUMENTS

| 3,614,554 A | 10/1971 | Shield et al. |
| 2007/0246805 A1 | 10/2007 | Zhang et al. |

(Continued)

FOREIGN PATENT DOCUMENTS

EP 1901353 A2 3/2008

OTHER PUBLICATIONS

Nian X. Sun, "RF Magnetic Films and Their Applications in Integrated Magnetic Devices", International Workshop on Power Supply on Chip, Cork Ireland, Oct. 13-15, 2010, 23 pages.

(Continued)

*Primary Examiner* — Edward Wojciechowicz
(74) *Attorney, Agent, or Firm* — Gardere Wynne Sewell LLP (57) ABSTRACT

An embodiment of an electronic device includes first and second semiconductor bodies. The first semiconductor body houses a first conductive strip having a first end portion and a second end portion, and houses a first conduction terminal electrically coupled to the first end portion and facing a surface of the first semiconductor body. The second semiconductor body houses a second conductive strip having a third end portion and a fourth end portion, and houses a second conduction terminal electrically coupled to the third end portion and facing a surface of the second semiconductor body. The first and second semiconductor bodies are arranged relative to one another so that the respective surfaces face one another, and the first conduction terminal and the second conduction terminal are coupled to one another by means of a conductive element so as to form a loop of an inductor.

27 Claims, 9 Drawing Sheets

(56) References Cited

U.S. PATENT DOCUMENTS

2008/0044660 A1* 2/2008 Takaya et al. ............. 428/413
2011/0095395 A1* 4/2011 Ellul et al. ............. 257/531

OTHER PUBLICATIONS

Saibal Roy, "Challenges in Magnetics for PwrSoC—Development in High-Frequency Magnetics, Materials and Integration", International Workshop on Power Supply on Chip, Cork Ireland, Oct. 13-15, 2010, 31 pages.

Search report based on Italian application TO20110804, Ministero dello Sviluppo Economico, The Hague, Aug. 23, 2012, 2 pages.

Donald S. Gardner, Gerhard Schrom, Peter Hazucha, Fabrice Paillet, Tanay Karnik, and Shekhar Borkar, "Integrated On-chip Inductors With Magnetic Films", IEEE Transactions on Magnetics, vol. 43, No. 6, Jun. 2007, pp. 2615-2617.

* cited by examiner

ELECTRONIC SEMICONDUCTOR DEVICE WITH INTEGRATED INDUCTOR, AND MANUFACTURING METHOD

PRIORITY CLAIM

The instant application claims priority to Italian Patent Application No. TO2011A000804, filed Sep. 9, 2011, which application is incorporated herein by reference in its entirety.

TECHNICAL FIELD

An embodiment relates to an electronic device, in particular of a semiconductor type, provided with an integrated inductor, and to a manufacturing method. In an embodiment, the electronic device is, in particular, a DC-DC converter.

BACKGROUND

DC-DC converters have assumed, and continue to assume, increasing importance in a plurality of electronic systems and devices, such as, for example, portable devices like cell phones and laptop computers, which are supplied via batteries. Said electronic devices usually include a plurality of electrical circuits and subcircuits, each of which requires, for its own operation, a level of voltage different from the one supplied by the battery. Furthermore, the voltage of the battery decreases during use thereof, as the power is drawn off. DC-DC converters are used in such applications in so far as they enable a method of generation of one or more controlled voltage levels starting from a variable supply voltage, such as, for example, the voltage supplied by a battery. An advantage of using a DC-DC converters may be a considerable saving of space in so far as it makes up for the need to use as many different supply sources as are different voltage levels required by the various electronic circuits for their operation. In particular, electronic switch-mode DC-DC converters carry out a DC-DC conversion by applying a DC voltage across an inductor for a predetermined period of time (usually in a frequency range of approximately from 100 kHz to 5 MHz) so as to generate a flow of electric current and store magnetic energy in the inductor. When, then, the voltage across the inductor is removed, the energy stored is transferred as output voltage and current of the DC-DC converter in a controlled way. By acting on the duty cycle, i.e., the time ratio of switching-on/switching-off, the output voltage remains regulated even though the load current may vary. This method of conversion is very power efficient (the efficiency is typically between approximately 80% and 95%), unlike other solutions, such as linear methods of conversion, which dissipate more power.

The external passive components, such as inductors and capacitors used in integrated DC-DC converters, have a value of impedance that depends upon the switching frequency and upon the power that the converter is designed to supply. In the last few years, DC-DC-converter designers have been increasing said switching frequency so as to be able to reduce the dimensions of the inductors to values such that they can be integrated in the converter package (in order to obtain the so-called "Systems in Package", or SiPs), or even integrated in the die or chip itself (the so-called "Systems-on-Chip", SoCs). Reference may be made, for example, to Saibal Roy "Challenges in magnetics for PwrSoC—Development in highfrequency magnetics, materials and integration", PWR'SoC 2010 Cork, Ireland, which is incorporated by reference.

As is known, inductors are formed by a low-resistance metal winding, which surrounds a core, which may be made of magnetic material. To provide a microinductor or an integrated inductor, it is typically necessary to have available low-resistivity metal paths and a magnetic material in the form of thin film. In order to maximize the quality factor Q of the inductor, the magnetic material has low coercivity, high saturation, and good response at high frequencies (>10 MHz). Another requisite of the magnetic material for it to be integrated in current micromachining processes is for it to be compatible with silicon processes. Various materials have been studied and many others are still under study (see, for example, Nian X. Sun "RF Magnetic Films and Their Applications in Integrated Magnetic Devices", PWR'SoC 2010 Cork, Ireland, which is incorporated by reference.

There currently exist a plurality of different approaches for providing an integrated inductor, the best known of which envisages forming a planar loop surrounded by two thin layers of magnetic material defined lithographically. Said method is, for example, known from Donald S. Gardner "Integrated On-chip Inductors With Magnetic Films", IEEE Transactions On Magnetics, Vol. 43, No. 6, June 2007, which is incorporated by reference.

The methods of manufacture of integrated inductors of a known type envisage complete integration of the magnetic material on the die of the DC-DC converter, and thus require that the processes of machining of the magnetic material do not come to affect the previous processes of machining of silicon, in effect reducing the choice of the magnetic materials that can be used to a limited group.

SUMMARY

An embodiment is an electronic device equipped with an integrated inductor, and a manufacturing method, that overcome one or more drawbacks of the known art.

According to an embodiment, two semiconductor bodies are formed, each housing a different portion of an inductor. The semiconductor bodies are coupled to one another with the flip-chip technique so that the portions of the inductor housed by them form, when coupled together, a complete inductor. A first semiconductor body houses circuitry of an electronic device (for example, a DC-DC converter) formed according to manufacturing processes typical of the semiconductor industry, and including, for example, at least some steps from among: implantation and diffusion of dopant elements, lithography and formation of metal and/or insulating layers. The last metal layer of the first semiconductor body (facing the surface of the semiconductor body) forms a first portion of the loop of the inductor. According to an embodiment, the second die houses, in addition to its own portion of the inductor, a magnetic layer adapted to form a magnetic core of the inductor. When coupled together, for example, via conductive solder bumps, the portions of the inductor form a plurality of turns that envelop the magnetic core. The magnetic core is hence enclosed within the inductor winding.

BRIEF DESCRIPTION OF THE DRAWINGS

One or more embodiments are now described, purely by way of non-limiting example and with reference to the attached drawings, wherein.

DETAILED DESCRIPTION

Figure 1:
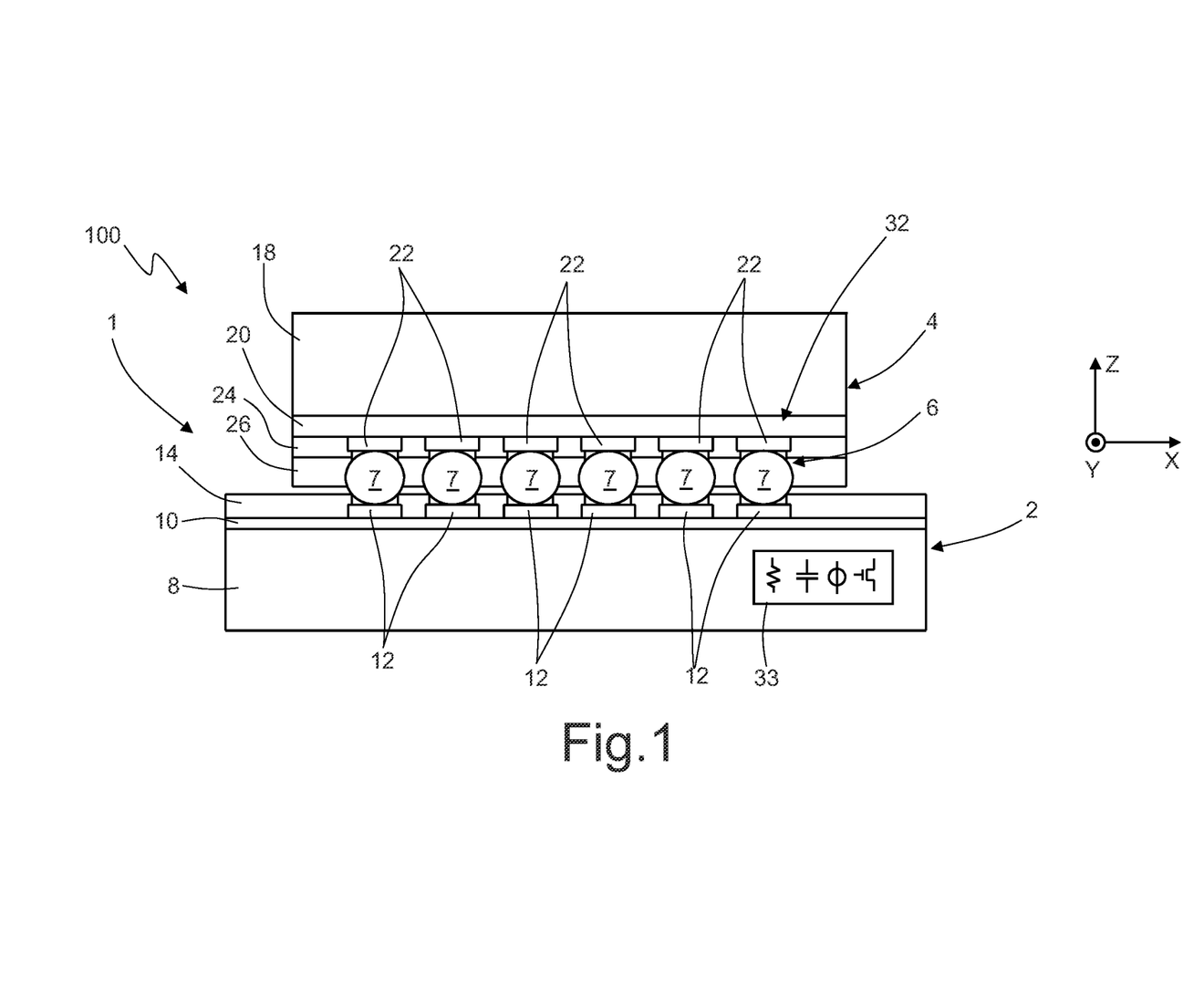
FIG. 1 is a cross-sectional view of an electronic device including an integrated inductor according to an embodiment.
Figure 2:
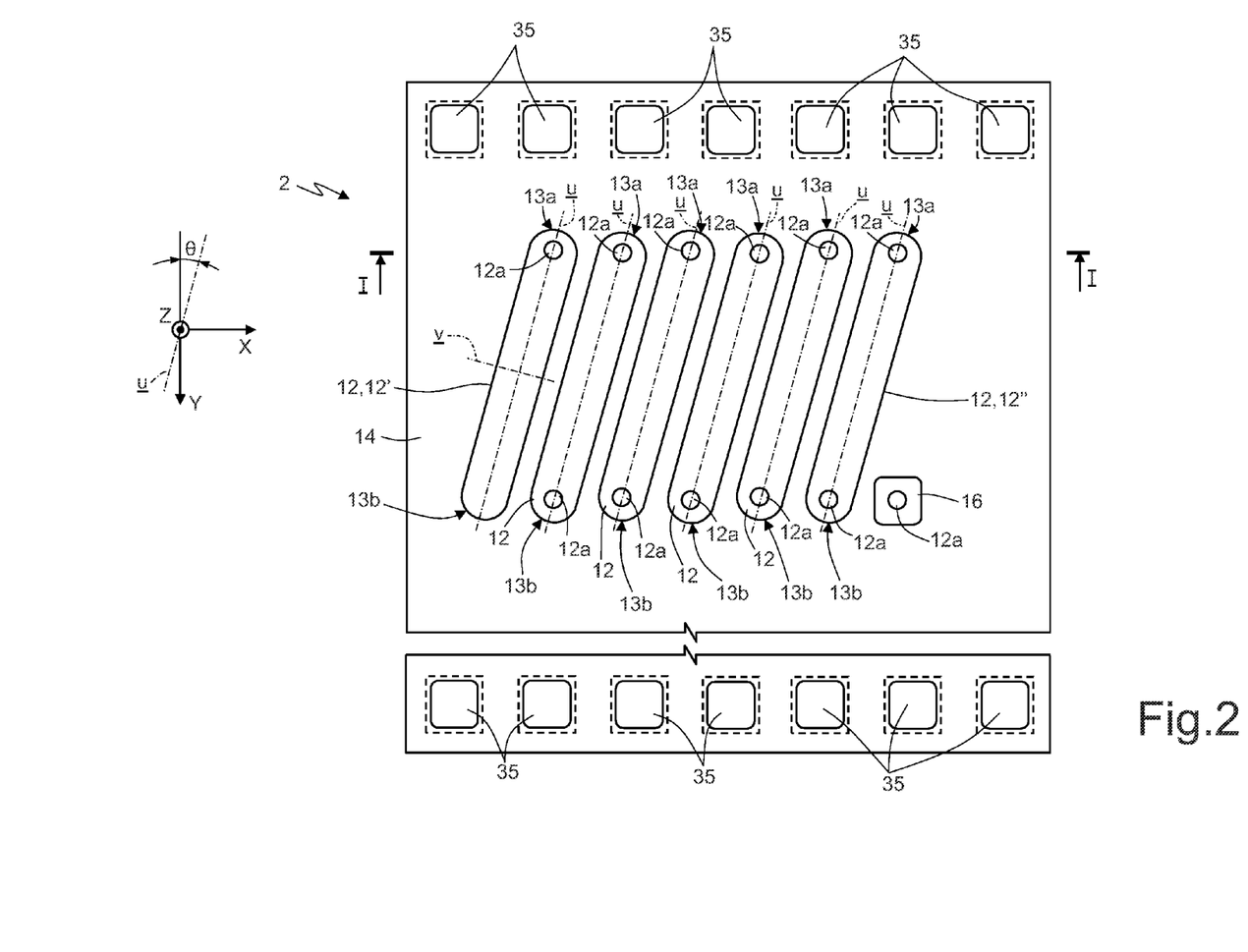
FIG. 2 is a top view of a first die of the electronic device of FIG. 1 according to an embodiment.

FIG. 1 shows, in cross-sectional view taken along the line of cross section I-I of FIG. 2, a DC-DC converter 100, including an inductor 1 of an integrated type, according to an embodiment.

The DC-DC converter 100 includes a first die 2 and a second die 4, electrically coupled together via conductive contacts 6, in particular in the form of bumps 7 of metal material.

The cross section of the first and second dice 2, 4 of FIG. 1 is parallel to a plane XZ, according to the system of axes illustrated in FIG. 1. Views along different planes, for example, parallel to the plane XY, are provided in FIGS. 2 and 3

The first die 2 includes: a substrate 8 of semiconductor material, for example, silicon; a supporting layer 10 (having moreover also the function of electrical insulation), for example, silicon oxide (FOX and/or PMD) with a thickness of approximately between 0.3 μm and 3 μm, for example, approximately 1 μm; one or more strips 12 (a plurality of strips 12 is illustrated in FIG. 1), of conductive material, in particular metal, which extend on top of and in contact with the supporting layer 10; and an intermetal layer 14, of dielectric material, for example, silicon oxide, which extends on top of the supporting layer 10 and surrounds the strips 12 to protect and insulate the strips 12.

As may be seen more clearly in FIG. 2 (which shows the first die 2 in top plan view), the strips 12 include respective contact portions 12a adapted to form electrical-contact regions for the conductive contacts 6. The contact portions 12a are in electrical contact with each respective strip 12, at terminal portions of the respective strip 12. According to the embodiment illustrated in FIG. 2, each strip has a substantially rectangular shape with rounded corners, and the contact portions 12a are formed integral with each respective strip 12.

A different embodiment (not illustrated) envisages that the contact portions 12a are formed separately from the strips 12, and coupled to the latter via conductive paths or other conductive elements (for example, wires).

To return to FIG. 2, each strip 12 extends in a respective principal direction of extension u. The principal directions of extension u of each strip 12 are substantially parallel to one another. The contact portions 12a are arranged at mutually opposite ends 13a, 13b of each strip 12 in the principal direction of extension u.

Each strip 12 extends in the principal direction of extension u (major side of the rectangle that forms the strip 12) for a distance of approximately between 0.5 mm and 10 mm, for example, approximately 2 mm. Moreover, each strip 12 extends in a direction v (minor side of the rectangle that forms the strip 12), orthogonal to the principal direction of extension u, for a distance of approximately between 50 μm and 200 μm, for example, approximately 100 μm.

As may be noted from FIG. 2, the strips 12 are arranged to form a series of strips 12 set approximately parallel alongside one another and delimited laterally by strips 12' and 12". The strips 12 are electrically insulated from one another by a portion of the intermetal layer 14 that extends between them. The principal direction of extension u forms an angle θ, with the axis Y, between 0° and 90°, for example, approximately 20°.

The strip 12' includes just one contact portion 12a formed at the end 13a, whereas the end 13b is without contact portions 12a. Extending alongside the strip 12" is a conductive region 16 provided with a contact portion 16 similar to the contact portions 12a. The conductive portion 16 is made of the same material as the strips 12, and the contact portion 16a is approximately the same, as regards dimensional characteristics and material, as the contact portions 12a.

Contact portions 12a, arranged at the respective ends 13a of the strips 12, are aligned with respect to one another (within the production tolerances) in one and the same first direction of alignment approximately parallel to the axis X; contact portions 12a, arranged at the respective ends 13b of the strips 12, are aligned with respect to one another and to the contact portion 16a (within the production tolerances) in one and the same second direction of alignment approximately parallel to the first direction of alignment.

Furthermore, contact portions 12a arranged at a respective end 13a of a respective strip 12 are aligned, in a direction of alignment substantially parallel to the axis Y, with contact portions 12a arranged at a respective end 13b of strip 12 immediately set alongside the strip 12 considered.

Figure 3:
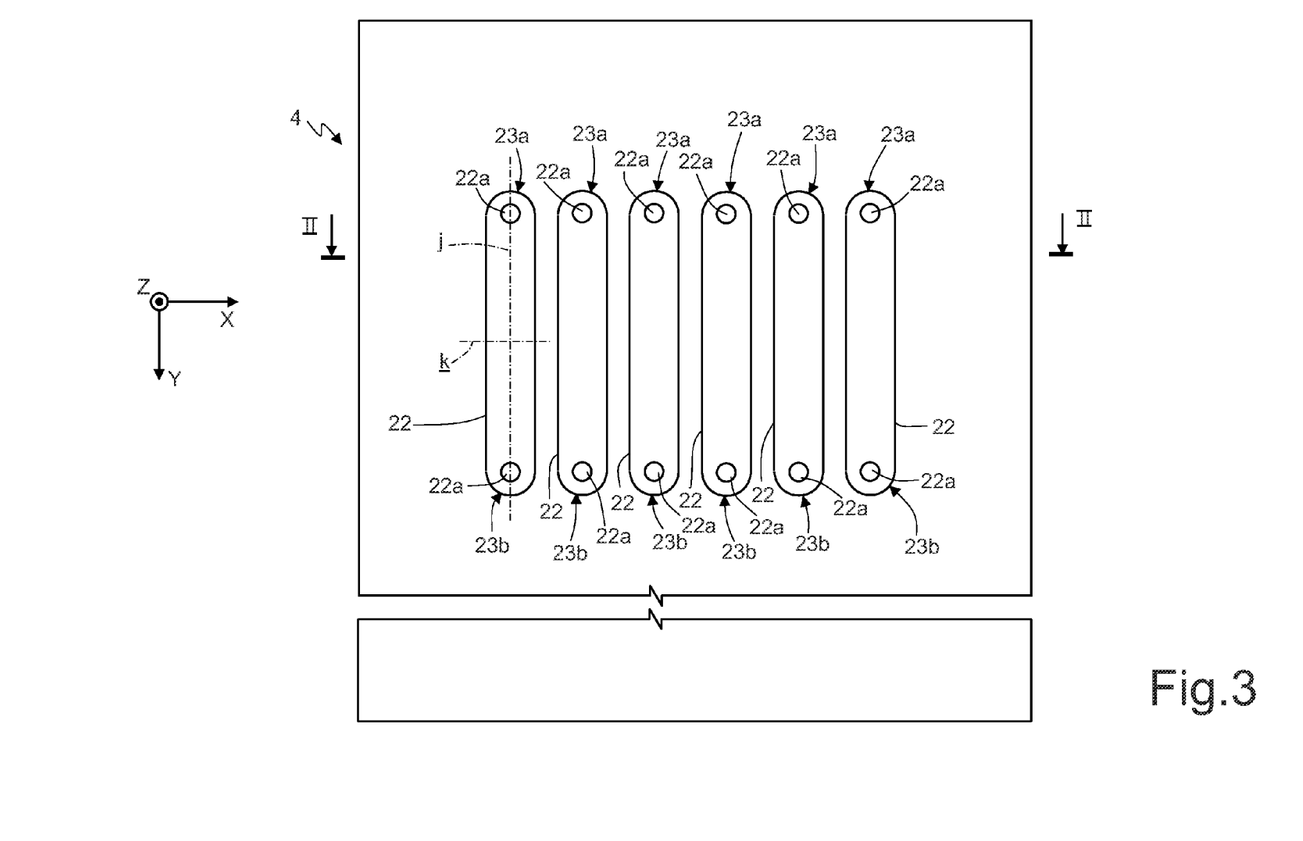
FIG. 3 is a top view of a second die of the electronic device of FIG. 1 according to an embodiment.

With joint reference to FIG. 1 and FIG. 3, the second die 6 includes a substrate 18 of semiconductor material, for example, silicon, a supporting layer 20 (having also the function of electrical insulator), for example, silicon oxide (FOX and/or PMD), with a thickness of approximately between 0.3 μm and 3 μm, for example, approximately 1 μm, one or more strips 22 (a plurality of strips 22, equal, in number, to the plurality of strips 12 of FIG. 2, is illustrated in FIG. 3), of conductive material, in particular metal, which extend on top of and in contact with the supporting layer 20, an intermetal layer 24, of dielectric material, which extends on top of the supporting layer 20 and surrounds the strips 22, to protect and insulate the strips 22, an insulation layer 26, which extends on top of the intermetal layer 24, and a magnetic layer 30 (not visible in the cross section of FIG. 1), which extends within the insulation layer 26. The insulation layer 26 and the magnetic layer 30 do not extend at terminal portions 23a and 23b of the strips 22 where contact portions 22a are formed, as described hereinafter.

The magnetic layer is, for example, made of a metal alloy having at least one property from among a high saturation magnetic field, low coercivity, good frequency response of magnetic permeability (>10 MHz), and high resistivity. Mixtures or alloys that satisfy one the more of said requisites are, for example, CoZrTa, NiFe, CoFeHfO, CoZrO, CoP, and CoFeSiB.

As may be seen more clearly in FIG. 3 (which shows, in top plan view, the second die 4), each strip 22 includes respective contact portions 22a adapted to form electrical-contact regions for the conductive contacts 6. The contact portions 22a are in electrical contact with each respective strip 22, and are formed integral with each respective strip 22 at terminal portions of the respective strip 22.

According to a different embodiment (not illustrated), the contact portions 22a are formed separately from the strips 22 and coupled to the latter via conductive paths.

According to the embodiment illustrated in FIG. 3, each strip 22 has a substantially rectangular shape with rounded corners, and extends in a respective principal direction of extension j. The principal directions of extension j of each strip 22 are substantially parallel to one another and substantially parallel to the axis Y. The contact portions 22a are arranged at ends 23a, 23b, mutually opposite in the principal direction of extension j, of each strip 22. Each strip 22 extends in the principal direction of extension j (major side of the rectangle that forms the strip 22) for a distance of approximately between 0.2 mm and 10 mm. Furthermore, each strip 22 extends in a direction k approximately orthogonal to the principal direction of extension j (minor side of the rectangle that forms the strip 22) for a distance of approximately between 50 μm and 200 μm, for example, approximately 100 μm.

The strips 22 are electrically insulated from one another by a portion of the intermetal layer 24 that extends between them.

Contact portions 22a, arranged at the respective ends 23a of the strips 22, are approximately aligned with respect to one another in one and the same first direction of alignment approximately parallel to the axis X (within the production tolerances); contact portions 22a, arranged at the respective ends 23b of the strips 22, are approximately aligned with respect to one another in one and the same second direction of alignment approximately parallel to the first direction of alignment (within the production tolerances).

With reference to FIG. 1, the first and second dice 2, 4 face one another so that contact portions 22a of the strips 22 of the second die 4 face, and are substantially aligned in the direction Z to, respective contact portions 12a of the strips 12 of the first die 2. The contact portions 12a are electrically coupled to the contact portions 22a by means of bumps 7. It is in this way that the inductor 1 is formed, the turns, or loops, of which are formed by the strips 12 and 22 coupled via the bumps 7. The inductor 1 is provided with a magnetic core (formed by the magnetic layer 30) set between the turns. The shape of the magnetic core (i.e., of the magnetic layer 30) can be linear, toroidal, or some other shape.

The inductor 1 thus formed can be biased by applying a difference of potential between the end 13b of the strip 12' (which hence has the function of first biasing terminal of the inductor 1) and the conductive region 16 (which hence has the function of second biasing terminal of the inductor 1). For this purpose, the first die 2 includes appropriate biasing means (not illustrated) coupled between the ends 13b of the strip 12' and the conductive region 16.

As an alternative to what has been illustrated and described so far herein, the first die 2 can include a first biasing terminal not coincident with the end 13b of the strip 12' (i.e., distinct from the strip 12'), but electrically coupled to the latter via appropriate electrical connections.

In general, irrespective of the embodiment of the strips 12, the first die 2 includes a plurality of devices, and/or active and/or passive components, and/or electronic circuits (designated as a whole by the reference number 33 in FIG. 1), adapted to manage biasing of the inductor 1 and form, together with the inductor 1, the DC-DC converter 100. The electronic components 33 that form the electrical circuitry of the inductor DC-DC 100 may be formed according to manufacturing processes of a known type, which are not described in detail herein. In general, the manufacturing process includes some or all of steps of implantation of dopant species, steps of thermal diffusion of the implanted dopant species, steps of lithography and etching, and steps of formation of metal and/or insulating layers. In an embodiment, the last-formed metal layer of the first die 2 forms the strips 12 of the inductor 1.

As may be seen in FIG. 2, the first die 2 further includes a plurality of conductive pads 35, adapted to be contacted by means of wire bonding for receiving/issuing supply signals and/or operative signals of the DC-DC converter 100. The pads 35 are arranged outside the area in which the strips 12 are formed. According to one embodiment (illustrated in FIG. 4), the second die 4 has a substantially quadrangular shape, with lateral dimensions smaller than the respective dimensions of the first die 2. In this way, when the first die 2 and the second die 4 are coupled together, the second die 4 extends on top of the first die 2 in an area between the pads 35.

Figure 4:
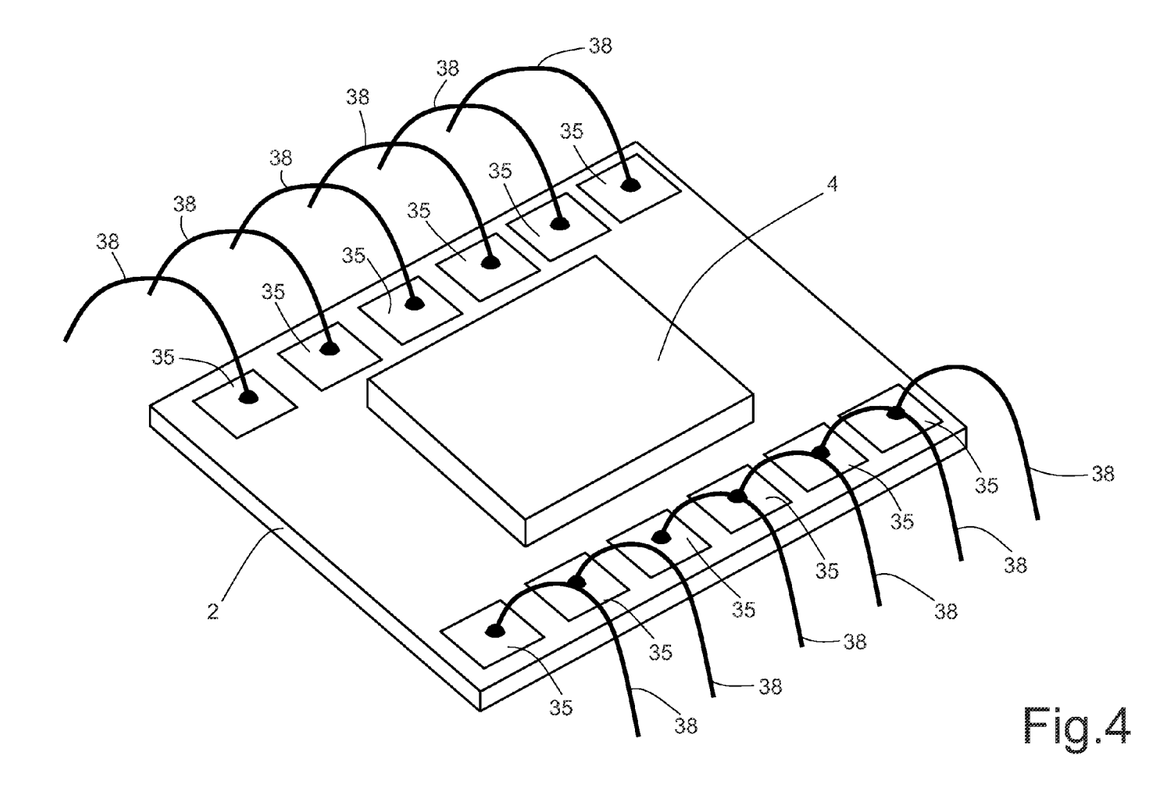
FIG. 4 is a perspective view of the electronic device of FIG. 1 according to an embodiment.

FIG. 4 moreover shows conductive wires 38 electrically coupled to the pads 35.

FIGS. 5-16 show steps of manufacture of the DC-DC converter 100 according to an embodiment, in particular with reference to the steps of manufacture of the inductor 1.

Figure 5:
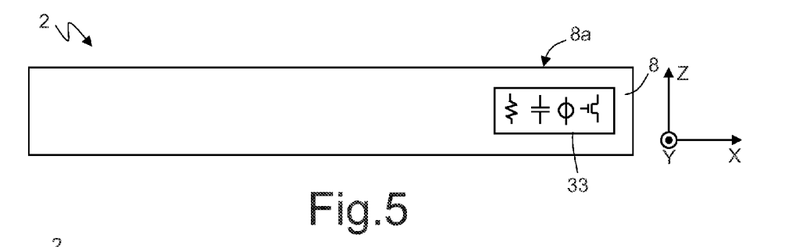
FIGS. 5-16 show process steps for forming the electronic device of FIG. 1 according to an embodiment.
Figure 6:
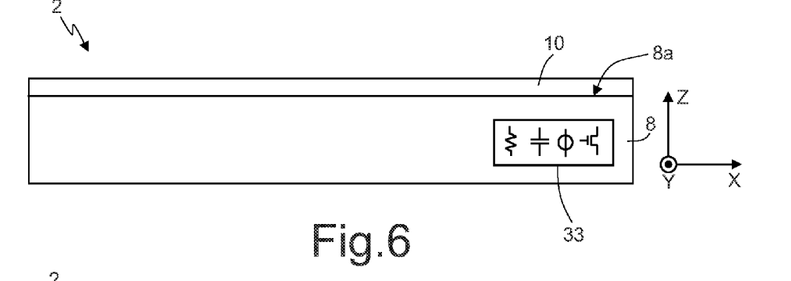

FIG. 5 shows, in cross-sectional view along the line of cross section I-I of FIG. 2, the first die 2.

In the step of FIG. 5, the first die 2 includes a previously machined substrate 8, in particular including active and passive electrical and electronic components 33, designed to form circuitry of a DC-DC converter. The substrate 8, made of semiconductor material, for example, silicon, can hence include, in a way not illustrated, a plurality of conductive and/or insulating layers (or regions) formed therein or thereover. The steps of machining of the first die 2 are typically carried out in a controlled environment or clean room, according to typical steps of CMOS processes.

Then (FIG. 6), formed on a top face 8a of the substrate 8, for example by means of deposition, is the supporting layer 10, for instance, made of silicon oxide (FOX and/or PMD), with a thickness of approximately between 0.3 μm and 3 μm, for example, approximately 1 μm, having the function of defining a resting base on which to form the strips 12 of the inductor 1.

Next (FIG. 7), a metal layer is deposited to form the last metal level of the first die 2 and defined by means of steps of lithography and etching so as to form the strips 12, having a shape and dimensions as described previously with reference to FIG. 2.

Figure 7:
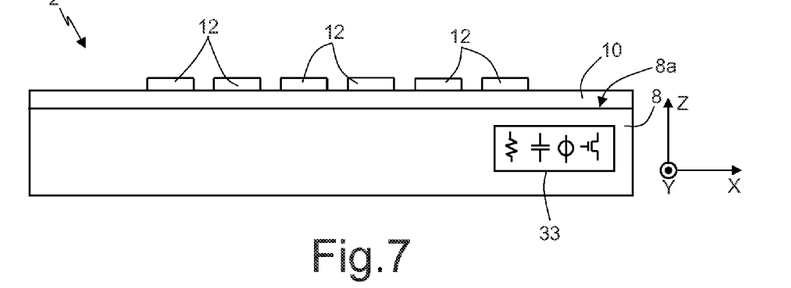
Figure 8:
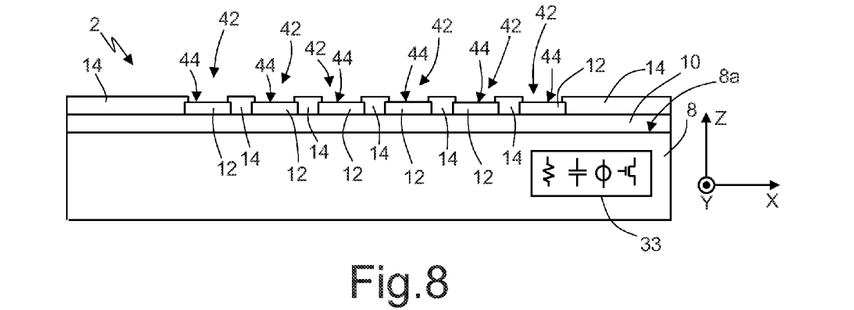

The metal layer that forms the strips 12 is made of a material with low conductivity, for example, aluminium or copper, and can be formed using the sputtering technique, or else with techniques of electrodeposition, or with the RDL (redistribution layer) technique.

Next (FIG. 8), an intermetal layer 14 of dielectric material, for example, silicon oxide, is deposited on top of the supporting layer 10 and the strips 12. A subsequent masked etching step enables formation of recesses 42 in the intermetal layer 14, at the ends 13a, 13b of the strips 12, exposing surface portions 44 of the strips 12. The surface portions 44 of the strips 12 thus exposed form the contact portions 12a described previously.

Figure 9:
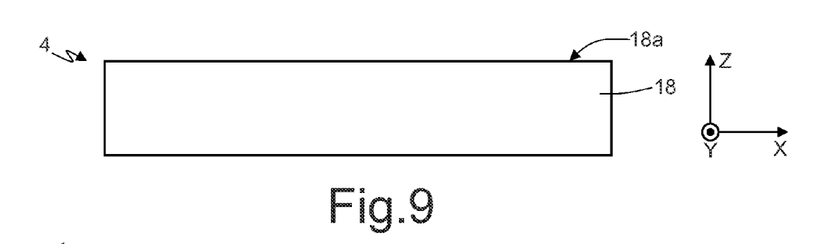

FIG. 9 shows, in cross-sectional view along the line of cross section II-II of FIG. 3, the second die 4, including, in this step, just the substrate 18, made of semiconductor material. The second die 4 can be machined in an environment with class of dustiness lower than the class of dustiness required for machining the first die 2, and/or on equipment not shared with the ones used for manufacturing the first die 2. In this way, the subsequent steps of machining of the second die 4 (in particular, the formation of the magnetic layer 30) can be carried out independently of the machining steps carried out on the first die 2 without any risk of contamination.

Then (FIG. 10), formed on the top face 18a of the substrate 18 is the supporting layer 20, which is made, for example, of silicon oxide (FOX and/or PMD) with a thickness of approximately between 0.3 μm and 3 μm, for example, approximately 1 μm, having the function of defining a resting base on which to form the strips 22 of the inductor 1.

Figure 10:
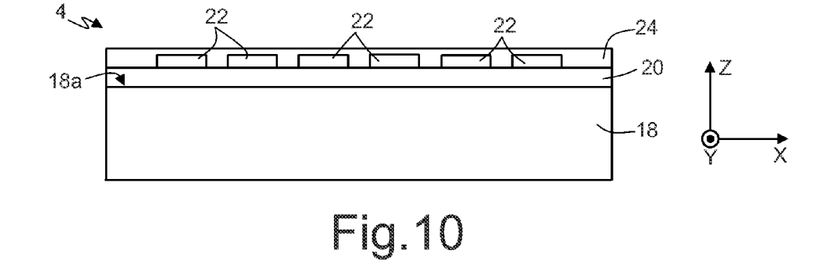

Next, a metal layer forming the last metal level of the second die 4 is deposited. Said metal layer is defined by means of steps of lithography and etching so as to form the strips 22, which have a shape and dimensions as described previously. The metal layer that forms the strips 22 is made of a material with low conductivity, for example, aluminium or copper, and can be obtained using the sputtering technique, or else with techniques of electrodeposition, or with the RDL (redistribution layer) technique.

Then, an intermetal layer 24 of dielectric material, for example, silicon oxide, is deposited on top of the supporting layer 20 and the strips 22.

Next (FIG. 11), formed, by means of deposition or growth, on top of the intermetal layer 24, is a first intermediate insulation layer 50, made, for example, of insulating material, such as silicon oxide or silicon nitride.

Figure 11:
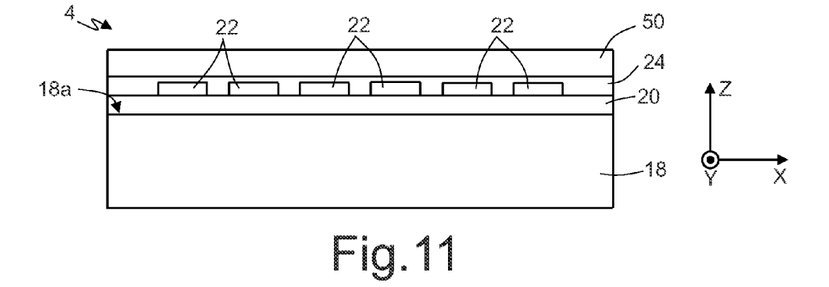
Figure 12:
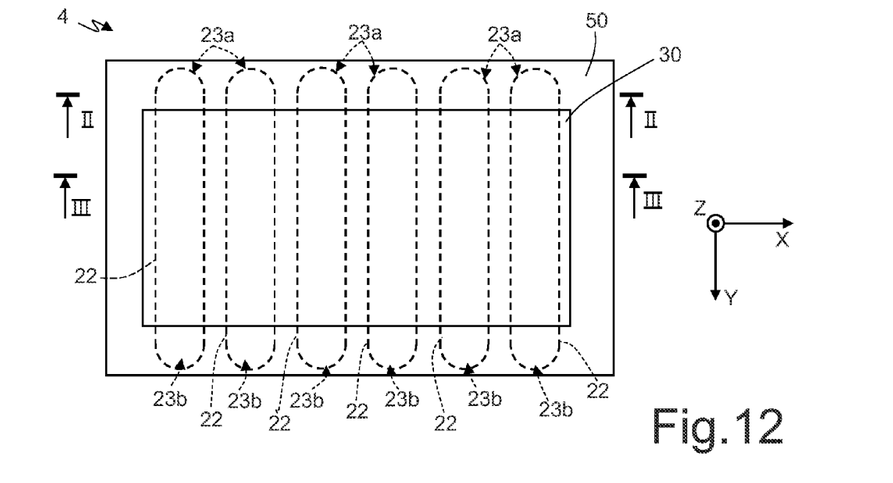
Figure 13:
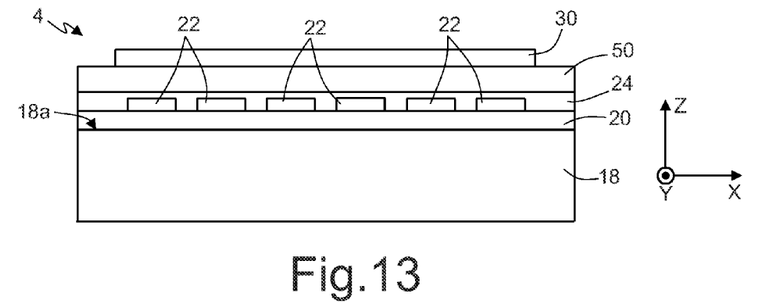

Formed on the first intermediate insulation layer 50 is the magnetic layer 30 (not visible in the cross section of FIG. 11; it is illustrated in FIGS. 12 and 13).

The magnetic layer 30 is formed by deposition of a layer of metal alloy (for example, chosen in the group including CoZrTa, NiFe, CoFeHfO, CoZrO, and CoP, CoFeSiB).

The methods of deposition of the magnetic layer 30 may be multiple, for example, sputtering, magnetron sputtering, electrodeposition, or any other method. The magnetic material can be deposited in a single layer or else in multiple layers of metal alloy separated by respective layers of insulating material (for example, silicon oxide or else a nitride of one of the components of the magnetic alloy). Alternatively, the magnetic material that forms the magnetic layer 30 can be deposited in the form of nanogranules immersed in a matrix of insulating material (such as, for example, silicon oxide or polymeric material).

It has been found that, when the magnetic layer 30 is formed by multiple layers of magnetic alloy separated by respective layers of insulating material, or else the magnetic material that forms the magnetic layer 30 is in the form of nanogranules immersed in insulating material, the parasitic currents in the magnetic layer 30, during use, are considerably reduced as compared to other structures.

If the magnetic layer 30 has not been formed with electrodeposition techniques, a further step of lithography and etching is envisaged to define the shape and dimensions of the magnetic layer 30. As an alternative to the step of lithography and etching, the magnetic layer 30 can be defined in shape and dimensions using the lift-off technique.

As may be seen more clearly in top view in FIG. 12, the magnetic layer 30 has dimensions such as to be contained at least partially within the area where the turns 22 extend, so that, when the first and second dice 2, 4 are coupled to one another, the magnetic layer 30 extends, for example, exclusively, within the region defined by the strips 12, 22 and by the bumps 7. More in particular, the magnetic layer 30 is formed so that it does not extend at the ends 23a and 23b of the strips 22 so as to leave exposed the regions where the contact portions 22a are then formed.

FIG. 13 shows a cross-sectional view of the second die 4 following the manufacturing steps described previously, taken along the line of cross section III-III of FIG. 12, where the magnetic layer 30 is shown in section.

Figure 14:
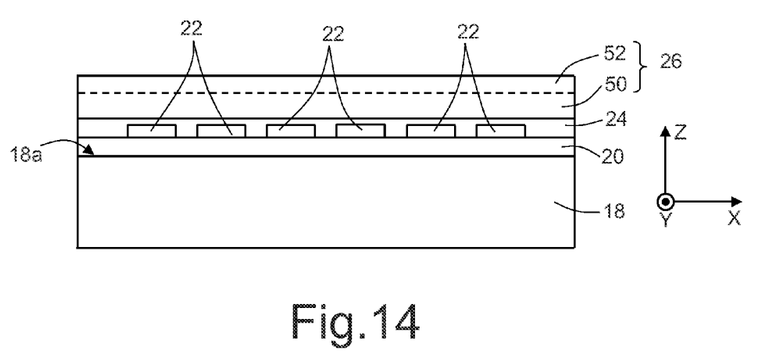

In FIG. 14, to return to the representation in cross section along the line of cross section II-II of FIG. 3 or FIG. 12, there is formed, for example, by means of deposition or growth, a second intermediate insulation layer 52, made of insulating material, such as, for example, silicon oxide or silicon nitride. The first intermediate insulation layer 50 and the second intermediate insulation layer 52 form the insulation layer 26.

Finally (FIG. 15), by means of successive lithography and etching steps, recesses 56 are formed in the insulation layer 26 at the ends 23a, 23b of the strips 22 to expose surface portions 58 of the strips 22. The surface portions 58 of the strips 22 thus exposed form the contact portions 22a described previously.

The steps of machining of the second die 4 may not require particular precautions as regards contamination of possible electronic components, or of the equipment used, by the magnetic material of which the magnetic layer 30 is made. In fact, the second die 4 may not house electronic components (all the circuitry necessary for operation of the DC-DC converter 100 being housed in the first die 2), and the steps of manufacture of the second die 4 can be carried out in places and according to modalities distinct from the steps of manufacture of the first die 2.

At the end of the manufacturing steps according to FIGS. 5-15, the second die is coupled (FIG. 16) to the first die (using the flip-chip technique) by means of bumps 7, which are in electrical contact with both of the contact portions 12a and 22a.

The first die 2 includes a first surface 2a and a second surface 2b, opposite to one another. The first surface 2a is the exposed surface of the substrate 8, whereas the second surface 2b is the surface (opposite to the first surface 2a along the axis Z) obtained at the end of the manufacturing steps described. Likewise, the second die 4 includes a first surface 4a and a second surface 4b, opposite to one another. The first surface 4a is the exposed surface of the substrate 18, whereas the second surface 4b is the surface (opposite to the first surface 4a along the axis Z) obtained at the end of the manufacturing steps described.

Figure 16:
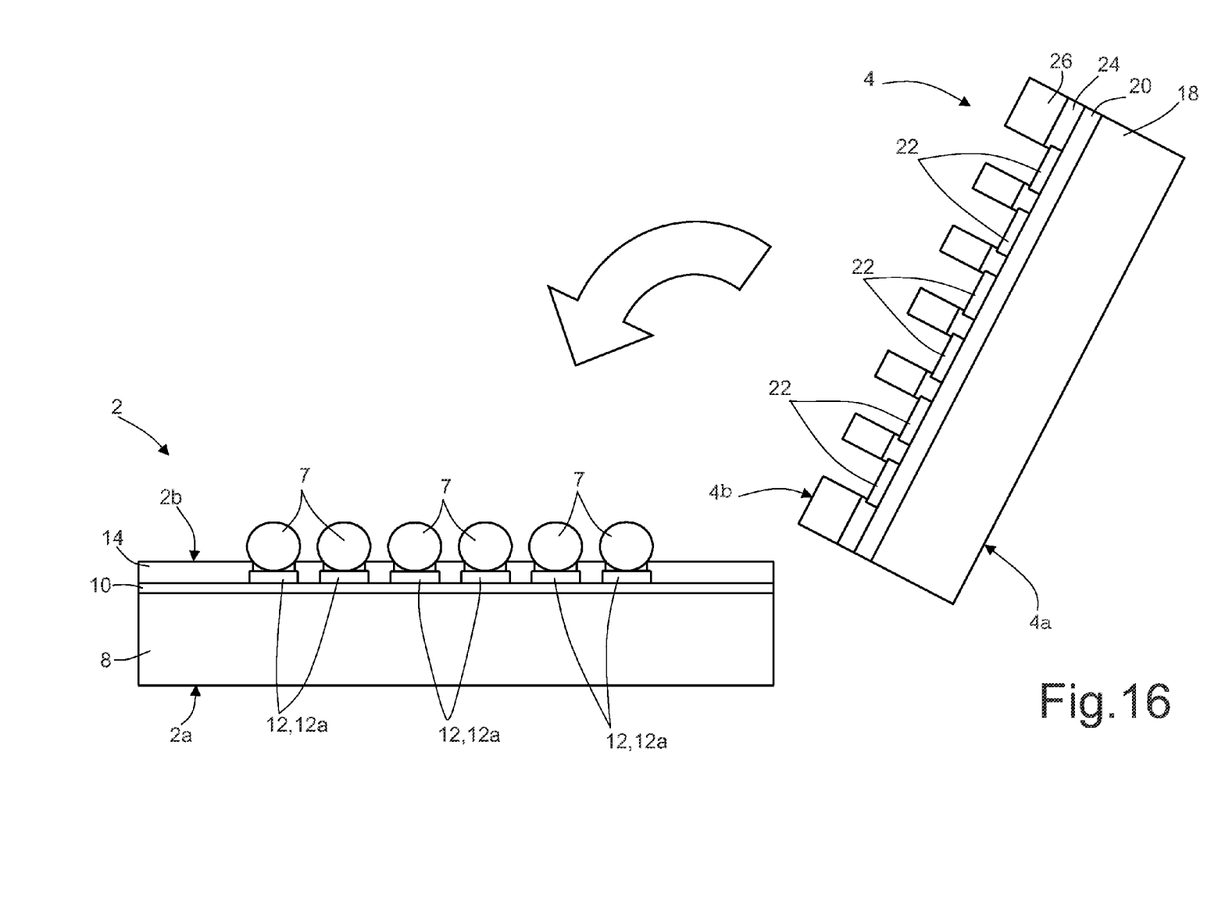

During the step described with reference to FIG. 16, the first and second dice are coupled together so that the respective second surfaces 2b and 4b face one another.

Figure 15:
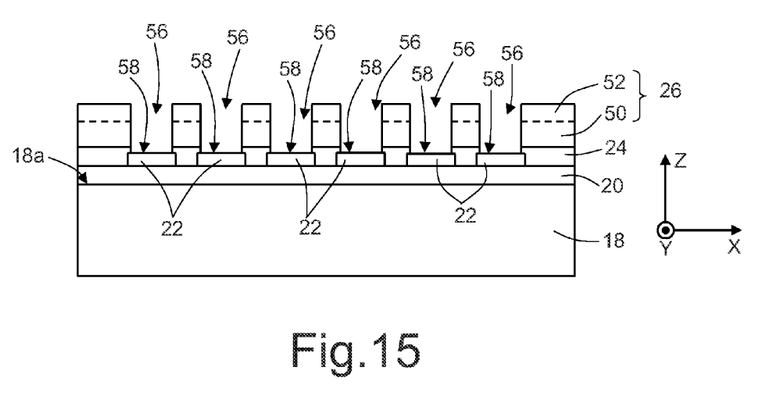

If it were to prove necessary, given the thickness of the intermetal layer 24 and the insulation layer 26, the recesses 56 can be partially or completely filled with conductive material, for example, metal, in order to facilitate the contact between the bumps 7 and the surface portions 58 of the strips 22. Typically, the thickness of the intermetal layer 24 and of the insulation layer 26 is such that this operation not is necessary (FIG. 15 is not in scale).

The bumps 7 can be formed, indifferently, in areas corresponding to the contact portions 12a and 22a of the first die 2 or of the second die 4 before the step of coupling using the flip-chip technique, and then coupling is carried out.

The flip-chip technique is also known in the literature as "Controlled Collapse Chip Connection", or C4.

The flip-chip technique is used in micromachining techniques for intercoupling semiconductor devices, such as, for example, integrated circuits, with external circuitry, typically by soldering respective electrical-contact portions via soldering elements known as "bumps".

The bumps 7 are deposited on the electrical-contact portions (for example, contact portions 12a) of a die (for example, the first die 2). In order to make a connection between the first and second dice 2, 4, one of the two dice (for example, the second die 4) is flipped on the other so that the first and second dice 2, 4 face one another and are aligned so that the respective electrical-contact portions 12a, 22a face one another and are coupled together via the bumps 7. Then, a step of heating (for example, via ultrasound) such as to melt the bumps 7 partially enables a secure contact to be obtained between the electrical-contact portions 12a and 22a of the dice 2, 4.

In this way, the inductor 1 including a continuous metal loop shaped like a spiral that envelops the magnetic layer 30 is formed, and is insulated electrically from the latter by means of the intermetal layers 14 and 24, and the insulation layer 26.

Figure 17:
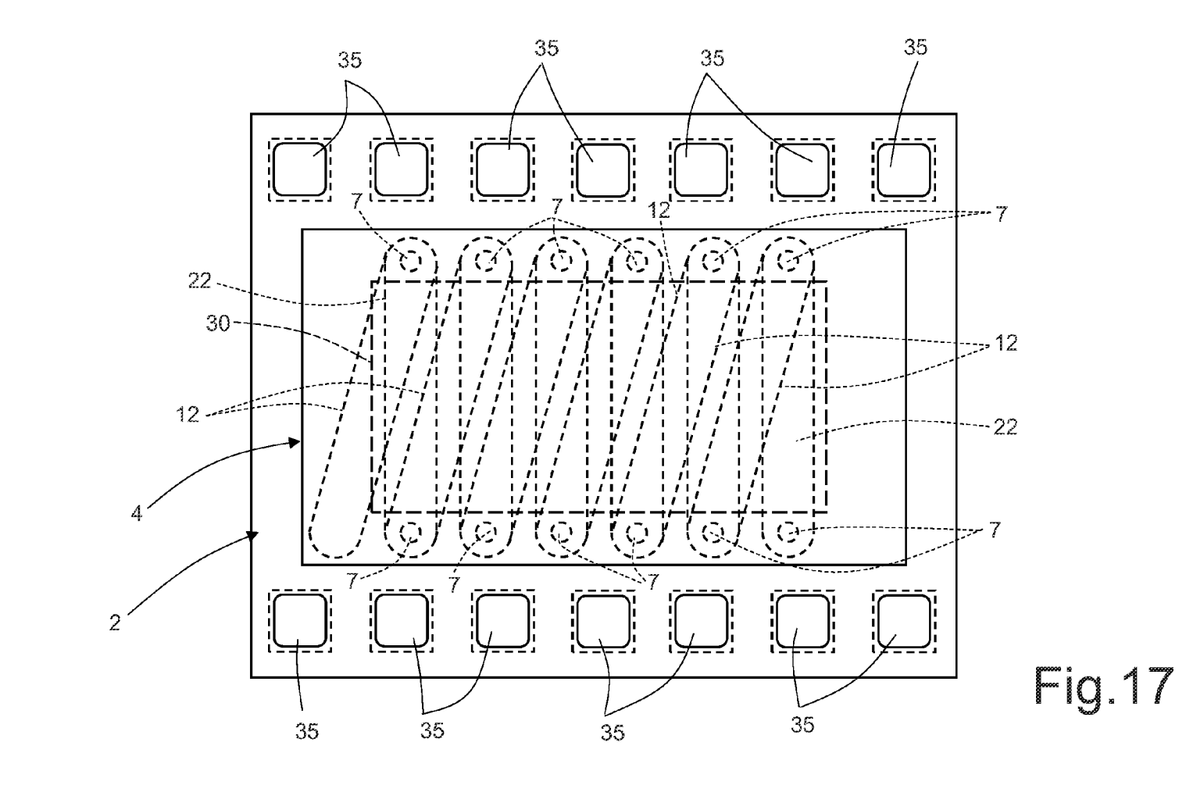
FIG. 17 is a top view of the electronic device of FIG. 1 according to an embodiment.

FIG. 17 shows, in top plan view, the first and second dice 2, 4 coupled together. In particular, the strips 12 and 22 and the magnetic layer 30 are visible in FIG. 17.

The stacked die thus obtained can be closed in a package using known packaging techniques. And the packaged DC-DC converter may be combined with one or more other components, such as processor (e.g., a microprocessor or microcontroller) to form a system.

From an examination of the characteristics of the embodiments according to the present disclosure one or more advantages of the embodiments are evident.

In particular, integration of the magnetic inductor, via the flip-chip technique described, may enable reduction to negligible values of the parasitic inductances that must be normally taken into account when an inductor is used outside the integrated circuit and coupled to the latter via paths on a printed circuit board (PCB), or else in the case of a co-packaged inductor, bonding between the IC and the micro-inductor.

Furthermore, integration of the inductor enables a drastic reduction of the dimensions of the entire DC-DC converter and the system in which the DC-DC converter is disposed, and at the same time reduction of the costs linked to the assembly of discrete components on a printed circuit.

In addition, one or more embodiments described enable reduction of the environmental impact of the manufacturing steps, given the smaller amount of magnetic material used and the better efficiency obtained by an integrated DC-DC conversion system as compared to a discrete one.

Finally, it is clear that modifications and variations may be made to what has been described and illustrated herein, without thereby departing from the sphere and spirit of the present disclosure.

In particular, it is evident that, even though the manufacturing steps of FIGS. 5-16 have been described with reference to two dice, said steps can be carried out on an entire wafer to form a plurality of DC-DC converters 100 each provided with a respective inductor 1. This is followed by dicing to isolate the individual dice.

Alternatively, the dice 2 and 4 can be generic semiconductor bodies.

In addition, the magnetic layer 30 may not be formed. In this case, the inductor has a dielectric core formed by the intermetal layers 14 and 24. The insulation layer 26 may be unnecessary in the absence of the magnetic layer 30.

Furthermore, the embodiments described include an inductor having a plurality of turns or loops. But it is evident that said inductor can include just a single turn or loop.

Moreover, according to an embodiment a plurality of inductors of the type described can be formed on one and the same die. The plurality of inductors can belong to a respective plurality of electronic devices or else to one and the same electronic device, which uses more than one inductor for its operation (e.g., a multiphase DC-DC converter).

Finally, the teachings according to the present disclosure can be extended to generic electronic apparatuses, other than a DC-DC converter, that include one or more inductors.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
   a first substrate;
   first conductors disposed over the first substrate and each having a first contact and a second contact, the first contacts approximately aligned with each other and the second contacts approximately aligned with each other;
   a first insulating layer covering the first conductors and having a first top surface with a plurality of first openings in the first top surface exposing the first and second contacts of the first conductors;
   a second substrate;
   second conductors disposed over the second substrate and each having a first contact and second contact, the first contacts approximately aligned with each other and the second contacts approximately aligned with each other;
   a second insulating layer covering the second conductors and having a second top surface with a plurality of second openings in the second top surface exposing the first and second contacts of the second conductors;
   wherein the first and second top surfaces face each other with the first openings aligned with each other and the second openings aligned with each other; and
   a plurality of solder bumps within the aligned first and second openings to electrically connect the first and second conductors to form an inductor.

2. The apparatus of claim 1, wherein the first and second conductors are formed from a metal.

3. The apparatus of claim 1 wherein the first conductors extend approximately parallel to one another and the second conductors extend approximately parallel to one another.

4. The apparatus of claim 1 wherein spacings between respective pairs of immediately adjacent ones of the first and second conductors are approximately the same.

5. The apparatus of claim 1 wherein:
   each of the first and second conductors has respective first and second end portions;
   the first contact of each first and second conductor is disposed within the first end portion of the first and second conductor; and
   the second contact of each first and second conductor is disposed within the second end portion of the first and second conductor.

6. The apparatus of claim 1, further comprising circuitry integrated in the first substrate and electrically coupled to at least one of the first conductors.

7. The apparatus of claim 1, further comprising power-supply circuitry coupled to at least one of the first conductors.

8. The apparatus of claim 1, further comprising a magnetic material disposed between the first and second conductors.

9. The apparatus of claim 1, further comprising:
   a magnetic material disposed between the first and second conductors; and
   the magnetic material is configured to form a portion of a core of the inductor.

10. The apparatus of claim 1, further comprising at least one conductive pad disposed over the first substrate and remote from the first conductors.

11. The apparatus of claim 1, further comprising an end conductor disposed over the first substrate and having only one of the first and second contacts.

12. The apparatus of claim 1, further comprising an end contact disposed over the first substrate and being separate from the first and second conductors.

13. An apparatus, comprising:
a first substrate;
a second substrate;
a first conductor disposed over the first substrate and having first and second contacts;
a second conductor disposed over the second substrate and having third and fourth contacts;
a third conductor disposed over the first substrate and having fifth and sixth contacts;
wherein a top surface of the first substrate faces a top surface of the second substrate with the second and third contacts aligned and with the fourth and fifth contacts aligned; and
solder bumps between the aligned second and third contacts and between the aligned fourth and fifth contacts to electrically connect the first and second and third conductors together form a conductive path.

14. The apparatus of claim 13 wherein the conductive path forms an inductor.

15. The apparatus of claim 13 wherein the conductive path forms an antenna.

16. The apparatus of claim 13, further comprising a core disposed between the first conductor and the second conductor.

17. The apparatus of claim 13, further comprising a magnetic material disposed between the first conductor and the second conductor.

18. The apparatus of claim 13, further comprising:
wherein the conductive path forms an inductor; and
circuitry disposed on at least one of the first and second substrates and coupled to the inductor such that the combination of the circuitry and the inductor is configured to generate a regulated supply signal.

19. The apparatus of claim 13, further comprising:
wherein the conductive path forms an inductor; and
a DC-DC converter including the inductor, including other circuitry disposed on at least one of the first and second substrates and coupled to the inductor, and configured to generate a regulated supply voltage.

20. The apparatus of claim 13, further comprising:
a package; and
wherein the first and second substrates are disposed within the package.

21. An apparatus, comprising:
a first semiconductor substrate having a top face and including an integrated circuit device;
a first insulating layer disposed on the top face of the first semiconductor substrate;
a plurality of parallel first conductive lines formed over the first insulating layer;
a first dielectric layer covering the plurality of parallel first conductive lines and including first openings exposing end portions of the plurality of parallel first conductive lines;
a second semiconductor substrate having a top face;
a second insulating layer disposed on the top face of the second semiconductor substrate;
a plurality of parallel second conductive lines formed over the second insulating layer;
a second dielectric layer covering the plurality of parallel second conductive lines and including second openings exposing end portions of the plurality of parallel second conductive lines;
wherein the first and second openings in the first and second dielectric layers face each other; and
a plurality of solder bumps within the facing first and second openings to electrically interconnect the first and second conductive lines to each other.

22. The apparatus of claim 21, further comprising a magnetic material provided within an insulating layer between the first and second dielectric layers.

23. The apparatus of claim 22, wherein the electrically interconnected first and second conductive lines form an inductor and the magnetic material forms a core of said inductor.

24. The apparatus of claim 21, wherein the first and second conductive lines are formed from a metal.

25. The apparatus of claim 21, wherein the integrated circuit device is a circuit component of a voltage regulator circuit.

26. The apparatus of claim 25, wherein the voltage regulator circuit is a DC-DC converter.

27. The apparatus of claim 21, wherein the electrically interconnected first and second conductive lines form an antenna.

* * * * *